(12) United States Patent
Ando et al.

(10) Patent No.: US 6,333,661 B1
(45) Date of Patent: Dec. 25, 2001

(54) INSULATED-GATE TRANSISTOR SIGNAL INPUT DEVICE

(75) Inventors: Kotaro Ando; Yoshiro Aoki; Masaki Miyatake, all of Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,790

(22) Filed: Sep. 24, 1999

(30) Foreign Application Priority Data

Sep. 25, 1998 (JP) .................................................. 10-271514

(51) Int. Cl.[7] ................................ H03K 5/08; H03L 5/06
(52) U.S. Cl. ......................... 327/313; 327/312; 327/314; 327/318
(58) Field of Search ................................... 327/309, 310, 327/313, 314, 318, 320, 325

(56) References Cited

U.S. PATENT DOCUMENTS

| | | | |
|---|---|---|---|
| 4,066,918 | * | 1/1978 | Heuner et al. ........................ 327/318 |
| 4,078,200 | * | 3/1978 | Ritchie et al. ........................ 361/87 |
| 5,574,395 | * | 11/1996 | Kusakabe ............................... 327/309 |
| 5,640,189 | * | 6/1997 | Ohno et al. ........................... 347/141 |
| 5,774,100 | * | 6/1998 | Aoki et al. ............................. 345/87 |
| 6,078,205 | * | 6/2000 | Ohsawa et al. ....................... 327/314 |

FOREIGN PATENT DOCUMENTS

| | | |
|---|---|---|
| 5-307191 | 11/1993 | (JP) . |
| 9-80471 | 3/1997 | (JP) . |

* cited by examiner

*Primary Examiner*—Terry D. Cunningham
*Assistant Examiner*—Quan Tra
(74) *Attorney, Agent, or Firm*—Pillsbury Winthrop LLP

(57) ABSTRACT

An insulated-gate transistor signal input device includes an insulating substrate, a first clock line formed on the insulating substrate to receive a clock signal externally supplied, a clock buffer formed on the insulating substrate to process the clock signal supplied from the first clock line, a second clock line formed on the insulating substrate to input a signal obtained from the clock buffer to a shift register serving as a load circuit formed on the insulating substrate. The insulated-gate transistor signal input device further includes a first protection diode circuit connected to the first clock line to remove electrostatic charge from the first clock line, and a second protection diode circuit connected to the second clock line to remove electrostatic charge from the second clock line.

10 Claims, 3 Drawing Sheets

INSULATED-GATE TRANSISTOR SIGNAL INPUT DEVICE

BACKGROUND OF THE INVENTION

This invention relates to an insulated-gate transistor signal input device formed on an insulating substrate such as an array substrate incorporated in a liquid-crystal display device.

A typical active matrix liquid-crystal display device includes an array substrate in which pixel electrodes are arrayed in a matrix form, a counter substrate in which a counter electrode is formed to face the pixel electrodes, and a liquid-crystal layer held between the array substrate and counter substrate. The pixel electrodes are connected to a liquid-crystal driving circuit placed outside the array substrate, via the switching elements which are formed on the array substrate together with the pixel electrodes.

The switching element is constituted by an insulated-gate transistor such as a thin-film transistor (TFT) which has an insulated gate and a semiconductor layer formed on the array substrate. In recent years, there is a case where the liquid-crystal driving circuit is formed on the array substrate. In this case, the liquid-crystal driving circuit is formed as an insulated-gate transistor circuit constituted by a group of thin-film transistors having the same structure as that of the switching element.

When the array substrate has been electrostatically charged in the process of manufacturing the liquid-crystal display device, the insulated-gate transistor tends to be damaged or destroyed due to a surge voltage applied thereto according to the electrostatic charge.

For example, Jpn. Pat. Appln. KOKAI Publication No. 6-51346 and Jpn. Pat. Appln. KOKAI Publication No. 9-80471 disclose a protection diode circuit disposed near an Outer Lead-Bonding (OLB) pad to protect insulated-gate transistors from destruction caused by electrostatic charge applied from the OLB pad.

FIG. 1 shows a conventional liquid-crystal driving circuit in which the protection diode circuit disposed near an OLB pad for inputting a clock signal. In the liquid-crystal driving circuit, the clock signal is supplied from an OLB pad 41 through a clock line L1N to a clock buffer 42, and then from the clock buffer 42 through a clock line L2N to a driver section DR. The clock buffer 42 has a series of inverters 41-1, 42-2, ..., 42-n each constituted by p- and n-channel thin-film transistors, and performs a process of driving, in response to the clock signal, the total load capacitance of the clock line extending into the driver section DR.

A protection diode circuit DiN is constituted by a pair of p-channel thin-film transistors Tr1 and Tr2 whose current paths are connected in series between a power source line VDD and the clock line L1N and a pair of n-channel thin-film transistors Tr3 and Tr4 whose current paths are connected in series between a ground line GND and the clock line L1N. Each of the thin-film transistors Tr1, Tr2, Tr3 and Tr4 has a gate electrode connected to an end of the current path and constitute a diode reverse-biased by the power source voltage.

With the liquid-crystal driving circuit, the protection diode circuit D1N removes electrostatic charge applied from the OLB pad 41. Specifically, when the thin-film transistors Tr1 and Tr2 or thin-film transistors Tr3 and Tr4 are forward-biased by the electrostatic charge, they are turned on to remove the electrostatic charge to the power source line VDD or ground line GND. However, the clock line L2N is electrically separated from the clock line L1N by the gate insulating films of the thin-film transistors of the clock buffer 42, the protection diode circuit D1N cannot remove electrostatic charge applied to the clock line L2N. As a result, a thin-film transistor of the clock buffer 42 connected to the clock line L2N is damaged by the electrostatic charge. In this case, not only the reliability of the liquid-crystal driving circuit but also that of the liquid-crystal display device is impaired seriously. Furthermore, when the thin-film transistor of the clock buffer 42 is destroyed electrostatically, this leads to a decrease in the yield of the liquid-crystal display device.

BRIEF SUMMARY OF THE INVENTION

An object of the present invention is to provide an insulated-gate transistor signal input device which is reliably protected from electrostatic destruction.

The object is attained by an insulated-gate transistor signal input device which comprises an insulating substrate, a first wiring section formed on the insulating substrate to receive a signal externally supplied, an insulated-gate transistor signal processing circuit formed on the insulating substrate to process the signal supplied from the first wiring section, a second wiring section formed on the insulating substrate to input a signal obtained from the insulated-gate transistor signal processing circuit to a load circuit formed on the insulating substrate, a first protection diode circuit connected to the first wiring section to remove electrostatic charge from the first wiring section, and a second protection diode circuit connected to the second wiring section to remove electrostatic charge from the second wiring section.

With the insulated-gate transistor signal input device, electrostatic charge externally applied is removed by the first protection diode circuit, and electrostatic charge accumulated in and applied from the load circuit is removed by the second protection diode circuit. As a result, the insulated-gate transistor signal processing circuit is reliably protected from electrostatic destruction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An insulated-gate transistor signal input device according to an embodiment of the present invention will be explained with reference to the accompanying drawings.

Figure 2:
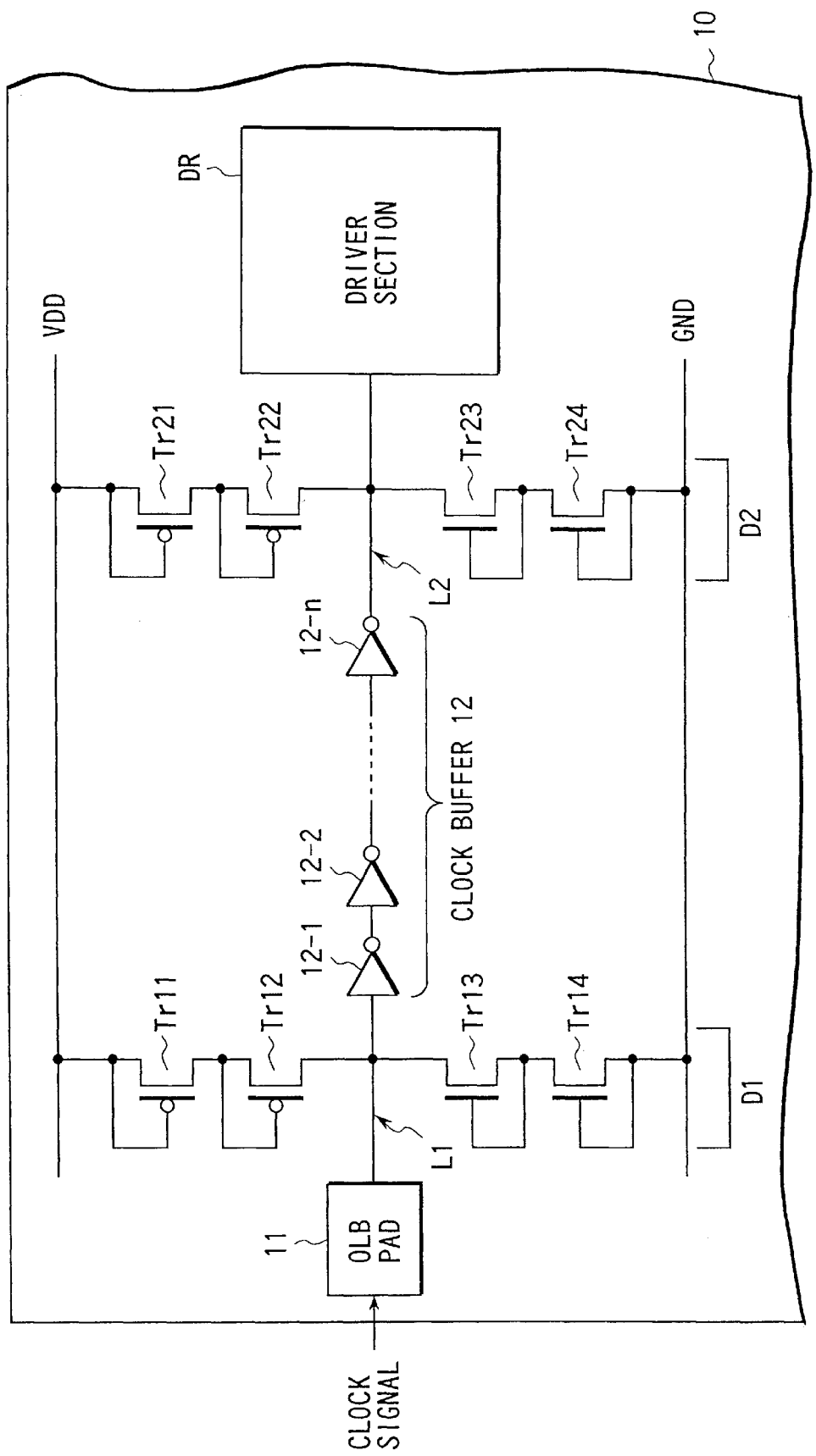
FIG. 2 is a block diagram showing the arrangement of an insulated-gate transistor signal input device according to an embodiment of the present invention.

FIG. 2 shows the arrangement of the insulated-gate transistor signal input device. The insulated-gate transistor signal input device is incorporated as a component of a liquid-crystal driving circuit on an array substrate of a liquid-crystal display device, and used to input a clock signal externally supplied to a load circuit serving as a driver section DR of the liquid-crystal driving circuit.

The insulated-gate transistor signal input device includes an OLB pad 11, a clock line L1, a clock line L2, a clock buffer 12, a protection diode circuit D1, and a protection diode circuit D2, which are formed on a glass insulating substrate 10 serving as the array substrate. The OLB pad 11 is formed on the periphery of the insulating substrate 10 to receive a clock signal externally supplied. The OLB pad 11 and clock buffer 12 are interconnected by the clock line L1, and the clock buffer 12 and driver section DR are interconnected by the clock line L2. Thus, the clock signal is supplied from the OLB pad 11 through the clock line L1 to the clock buffer 12 and further from the clock buffer 12 through the clock line L2 to the driver section DR. Each of the clock buffer 12, protection diode circuit D1, protection diode circuit D2, and driver section DR is constituted by a group of polycrystalline silicon thin-film transistors which are insulated-gate transistors.

Figures 1, 3:
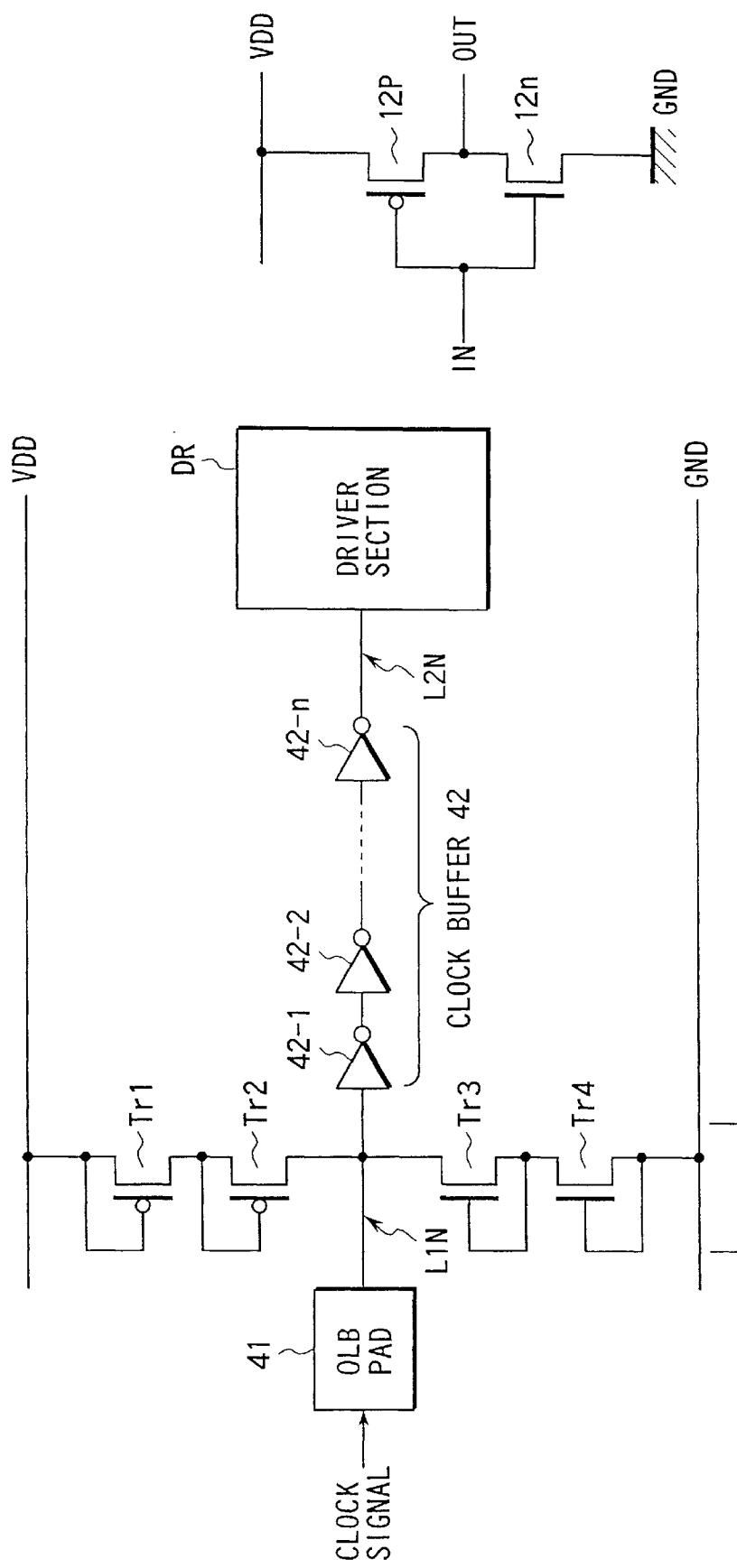
FIG. 1 is a block diagram showing the arrangement of a conventional protective circuit.
FIG. 3 is a diagram showing the circuit of each inverter in the clock buffer of FIG. 2.

The clock buffer 12 has a series of inverters 12-1, 12-2, . . . , 12-n and performs a process of driving, in response to the clock signal, the total load capacitance of the clock line L2 extending into the driver section DR. Each of the inverters 12-1, 12-2, . . . , 12-n is constituted by a p-channel thin-film transistor 12p and an n-channel thin-film transistor 12n, as shown in FIG. 3. The thin-film transistor 12p has a current path connected between a power source line VDD and an output terminal OUT and a gate electrode connected to an input terminal IN. The n-channel thin-film transistor 12n has a current path connected between the output terminal OUT and a ground line GND and a gate electrode connected to the input terminal IN.

The protection diode circuit D1 is constituted by a pair of p-channel thin-film transistors Tr11 and Tr12 whose current paths are connected in series between the power source line VDD and the clock line L1 and a pair of n-channel thin-film transistors Tr13 and Tr14 whose current paths are connected in series between the ground line GND and the clock line L1. Each of the thin-film transistors Tr11, Tr12, Tr13, and Tr14 has a gate electrode connected to an end of its current path to constitute a diode reverse-biased by the power source voltage.

The protection diode circuit D2 is constituted by a pair of p-channel thin-film transistors Tr21 and Tr22 whose current paths are connected in series between the power source line VDD and the clock line L2 and a pair of n-channel thin-film transistors Tr23 and Tr24 whose current paths are connected in series between the ground line GND and clock line L2. Each of the thin-film transistors Tr21, Tr22, Tr23, and Tr24 has a gate electrode connected to an end of its current path to constitute a diode reverse-biased by the power source voltage.

With the insulated-gate transistor signal input device, if electrostatic charge is applied to both of the clock lines L1 and L2, the electrostatic charge on the clock line L1 will be removed to the power source line VDD or ground line GND by the protection diode circuit D1, and the electrostatic charge on the clock line L2 will be removed to the power source line VDD or ground line GND by the protection diode circuit D2. This prevents a surge voltage from being applied to the elements on the array substrate.

The protection diode circuits D1 and D2 also applicable to surge voltages caused by factors other than electrostatic charge in the manufacturing process of the array substrate.

In the insulated-gate transistor signal input device, the protection diode circuit D2 is connected to the clock line L2 electrically separated from the OLB pad 11 by the clock buffer 12. A protection diode circuit similar to the protection diode circuit D2 may be connected to another line electrically separated from an OLB pad by an insulated-gate transistor signal processing circuit such as the clock buffer 12.

Figure 4:
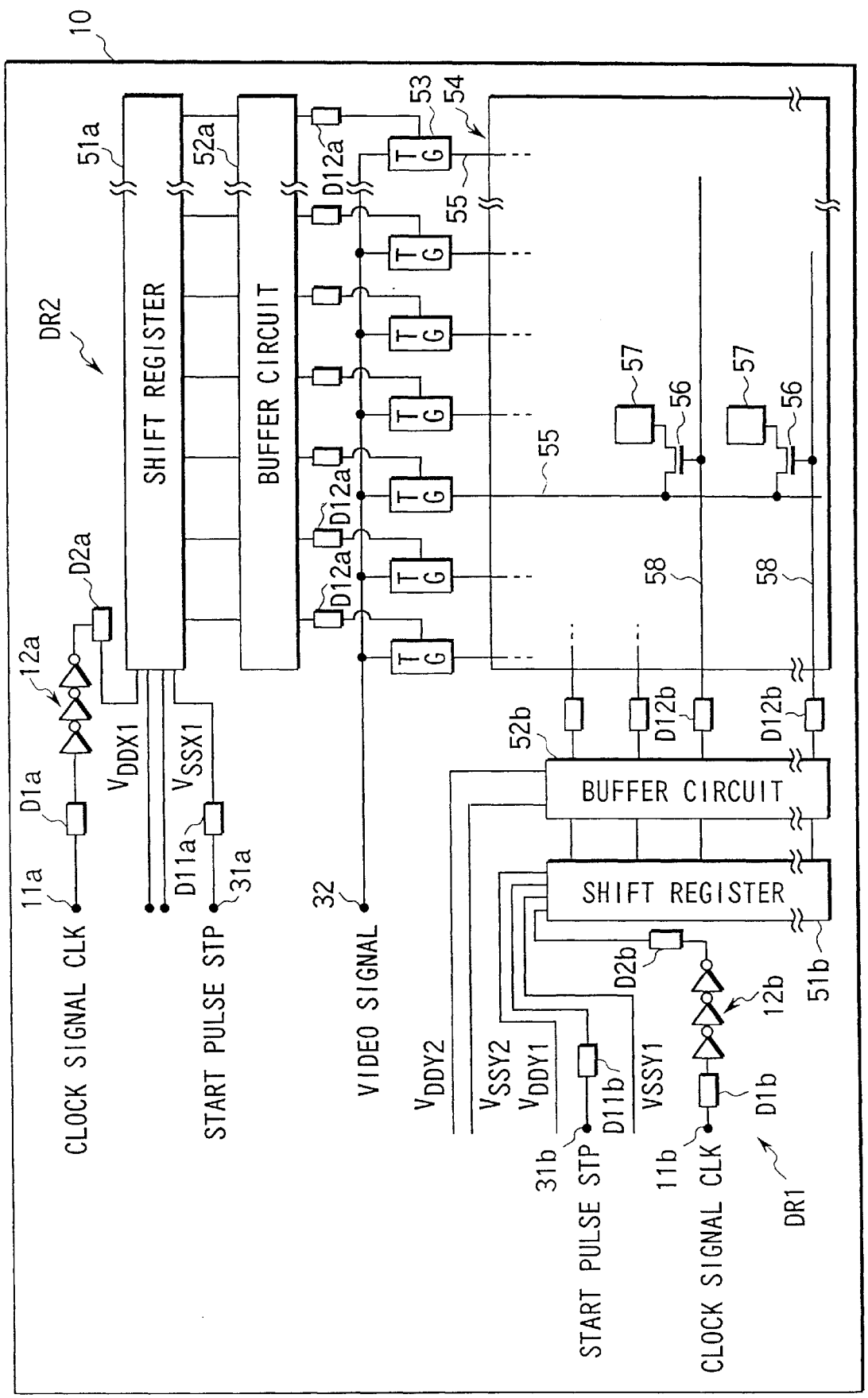
FIG. 4 is a block diagram showing examples of the insulated-gate transistor signal input device of FIG. 2 which are applied to various wirings of a liquid-crystal driving circuit.

FIG. 4 shows examples of the insulated-gate transistor signal input device of FIG. 2 which are applied to various wirings of a liquid-crystal driving circuit.

In FIG. 4, the liquid-crystal driving circuit is formed outside a display area 54 in which pixel electrodes 57 are arrayed in a matrix form. In the display area 54, scanning lines 58 are formed along the rows of pixel electrodes 57, signal lines 55 are formed along the columns of pixel electrodes 57, thin-film transistors 56 are formed near the intersections of the scanning lines 58 and signal lines 55 as switching elements for the pixel electrodes 57. Each scanning line 58 is connected to the gates of the thin-film transistors 56 in a corresponding row. Each signal line 55 is connected via the current paths of the thin-film transistors 56 in a corresponding column to the pixel electrodes 57 in the corresponding column. These scanning lines 58 are driven by a scanning line driver DR1 of the liquid-crystal driving circuit. These signal lines 55 are driven by a signal line driver DR2 of the liquid-crystal driving circuit. The scanning line driver DR1 includes a shift register 51b and a buffer circuit 52b. The shift register 51b shifts a start pulse STP from a start pulse OLB pad 31b in synchronism with the clock signal CLK from a clock signal OLB pad 11b via a clock buffer 12b to output the shifted start pulse STP sequentially from shift output terminals as gate signals. On the other hand, the signal line driver DR2 includes a shift register 51a, a buffer circuit 52a, and timing gates 53. The shift register 51a shifts a start pulse STP from a start pulse OLB pad 31a in synchronism with the clock signal CLK from a clock signal OLB pad 11a via a clock buffer 12a to output the shifted start pulse STP sequentially from shift output terminals as gate signals. The timing gates 53 sample the video signal from a video signal OLB pad in response to the gate signals output from the buffer circuit 52, and supply the sampled signals to the signal lines 55, respectively.

The clock buffer 12a is an insulated-gate transistor signal processing circuit formed of insulated-gate transistors which are arranged for processing the clock signal CLK supplied from the signal line clock signal OLB pad 11a to produce an input signal for the signal line driving shift register 51a. Thus, a protection diode circuit D1a is connected to a wiring between the OLB pad 11a and the clock buffer 12a, and a protection diode circuit D2a is connected to a wiring between the clock buffer 12a and the shift register 51a.

The clock buffer 12b is an insulated-gate transistor signal processing circuit formed of insulated-gate transistors which are arranged for processing the clock signal CLK supplied from the scanning line clock signal OLB pad 11b to produce an input signal for the scanning line driving shift register 51b. Thus, a protection diode circuit D1b is connected to a wiring between the OLB pad 11b and the clock buffer 12b, and a protection diode circuit D2b is connected to a wiring between the clock buffer 12b and the shift register 51b.

The shift register 51a and buffer circuit 52a constitute an insulated-gate transistor signal processing circuit formed of insulated-gate transistors which are arranged for processing the start pulse STP supplied from the start pulse OLB pad 31a to produce input signals for the timing gates 53. Thus, a protection diode circuit D11a is connected to a wiring between the OLB pad 31a and the shift register 51a, and protection diode circuits D12a are connected to wirings between the buffer circuit 52a and the timing gates 53.

The shift register 51b and buffer circuit 52b constitute an insulated-gate transistor signal processing circuit formed of insulated-gate transistors which are arranged for processing the start pulse STP supplied from the start pulse OLB pad 31b to produce input signals for the thin-film transistors 56 serving as the switching elements for the pixel electrodes 57. Thus, a protection diode circuit D11b is connected to a wiring between the OLB pad 31b and the shift register 51b, and protection diode circuits D12b are connected to wirings or scanning lines 58 between the buffer circuit 52b and the thin-film transistors 56.

Each of the protection diode circuits D1a, D11a, D1b, D11b has the same structure as that of the protection diode circuit D1 of FIG. 2. Each of the protection diode circuits D2a, D12a, D2b, D12b has the same structure as that of the protection diode circuit D2 of FIG. 2. In FIG. 4, VDDX1 and VSSX1 are power lines for the shift register 51a, VDDY1 and VSSY1 are power lines for the shift register 51b, and VDDY2 and VSSY2 are power lines for the buffer circuit 52b.

With the liquid-crystal driving circuit, electrostatic charge externally applied from the clock signal OLB pads 11a and 11b are discharged to one of the power source line VDD and the ground line GND by the protection diode circuits D11a and D11b, respectively. Electrostatic charge applied to the last stages of the clock buffers 12a and 12b are also discharged to one of the power source line VDD and the ground line GND by the protection diode circuits D2a and D2b, respectively. This protects the clocked buffers 12a and 12b from being destroyed due to a surge voltage caused by electrostatic charge.

Furthermore, electrostatic charge externally applied from the start pulse OLB pads 31a and 31b are discharged to one of the power source line VDD and the ground line GND by the protection diode circuits D11a and D11b, respectively. Electrostatic charge applied to the last stages of the buffer circuits 52a and 52b are also discharged to one of the power source line VDD and the ground line GND by the protection diode circuits D12a and D12b, respectively. This protects the shift registers 51a and 51b and buffer circuits 52a and 52b from being destroyed due to a surge voltage caused by electrostatic charge.

Each of the above protection diode circuits may be replaced with a protection circuit formed of MOS transistors or high-resistance elements arranged to attain the effect described above.

As described above, with the insulated-gate transistor signal input device, external electrostatic charge is removed by the first protection diode circuit connected to the input-side wiring of the insulated-gate transistor signal processing circuit, and the electrostatic charge accumulated in and applied from the load circuit is discharged by the second protection diode circuit connected to the output-side wiring of the insulated-gate transistor signal processing circuit. As a result, the insulated-gate transistor signal processing circuit is reliably protected from electrostatic destruction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An array substrate for a display comprising:

an insulating substrate;

a plurality of scanning lines formed on said insulating substrate;

a plurality of signal lines formed on said insulating substrate;

a plurality of switching elements formed at positions adjacent to intersections of said scanning lines and said signal lines;

a scanning line driver formed on said insulating substrate to drive said scanning lines; and a signal line driver formed on said insulating substrate to drive said signal lines;

wherein at least one of said scanning line driver and said signal line driver includes;

a first wiring section formed on said insulating substrate to receive a signal externally supplied;

an insulated-gate transistor signal processing circuit formed on said insulating substrate to process the signal supplied from the first wiring section;

a second wiring section formed on said insulating substrate to input a signal obtained from said insulated-gate transistor signal processing circuit to a load circuit formed on said insulating substrate;

a first protection diode circuit connected to said first wiring section to remove electrostatic charge from said first wiring section; and a second protection diode circuit connected to said second wiring section to remove electrostatic charge from said second wiring section.

2. An array substrate according to claim 1, wherein said insulated-gate transistor signal processing circuit is a clock buffer formed of insulated-gate transistors.

3. An array substrate according to claim 1, wherein said insulated-gate transistor signal processing circuit includes a shift register circuit which is formed of insulated gate transistors arranged to sequentially shift an input start pulse, and a buffer circuit for outputting the start pulse shifted by said shift register.

4. An array substrate according to claim 1, wherein said insulating substrate is a glass substrate.

5. An array substrate according to claim 1, wherein said insulated-gate transistor signal processing circuit is constituted by a group of polycrystalline silicon thin-film transistors.

6. An array substrate according to claim 1, wherein each of said first and second protection diode circuits is constituted by a group of polycrystalline silicon thin-film transistors connected to form diodes.

7. An insulated-gate transistor signal input device comprising:

an insulating substrate;

a first wiring section formed on said insulating substrate to receive a signal externally supplied;

an insulated-gate transistor signal processing circuit formed on said insulating substrate to process the signal supplied from the first wiring section;

a second wiring section formed on said insulating substrate to input a signal obtained from said insulated-gate transistor signal processing circuit to a load circuit formed on said insulating substrate;

a first protection diode circuit connected to said first wiring section to remove electrostatic charge from said first wiring section; and a second protection diode circuit connected to said second wiring section to remove electrostatic charge from said second wiring section;

wherein said insulated-gate transistor signal processing circuit includes a shift register circuit which is formed of insulated-gate transistors arranged to sequentially shift an input start pulse, and a buffer circuit for outputting the start pulse shifted by said shift register.

8. An insulated-gate transistor signal input device according to claim 7, wherein said insulating substrate is a glass substrate.

9. An insulated-gate transistor signal input device according to claim 7, wherein said insulated-gate transistor signal processing circuit is constituted by a group of polycrystalline silicon thin-film transistors.

10. An insulated-gate transistor signal input device according to claim 7, wherein each of said first and second protection diode circuits is constituted by a group of polycrystalline silicon thin-film transistors connected to form diodes.

* * * * *